United States Patent
Liu et al.

(10) Patent No.: US 9,958,342 B2
(45) Date of Patent: May 1, 2018

(54) NONINVASIVE MEASURING METHOD FOR RAPID TEMPERATURE VARIATION UNDER DC EXCITATION MAGNETIC FIELD

(71) Applicant: HUAZHONG UNIVERSITY OF SCIENCE AND TECHNOLOGY, Wuhan (CN)

(72) Inventors: Wenzhong Liu, Wuhan (CN); Pu Zhang, Wuhan (CN); Chuliang Ruan, Wuhan (CN); Wenbiao Xu, Wuhan (CN)

(73) Assignee: HUAZHONG UNIVERSITY OF SCIENCE AND TECHNOLOGY (CN)

( * ) Notice: Subject to any disclaimer, the term of this patent is extended or adjusted under 35 U.S.C. 154(b) by 317 days.

(21) Appl. No.: 14/766,111

(22) PCT Filed: Sep. 11, 2014

(86) PCT No.: PCT/CN2014/086283
§ 371 (c)(1),
(2) Date: Aug. 5, 2015

(87) PCT Pub. No.: WO2016/015369
PCT Pub. Date: Feb. 4, 2016

(65) Prior Publication Data
US 2016/0252405 A1    Sep. 1, 2016

(30) Foreign Application Priority Data

Jul. 31, 2014 (CN) .......................... 2014 1 0374814

(51) Int. Cl.
*G01K 7/38* (2006.01)
*G01K 7/36* (2006.01)
*G01R 33/02* (2006.01)

(52) U.S. Cl.
CPC ................. *G01K 7/38* (2013.01); *G01K 7/36* (2013.01); *G01R 33/0213* (2013.01)

(58) Field of Classification Search
CPC .............................................. G01K 7/36–7/38
See application file for complete search history.

(56) References Cited

U.S. PATENT DOCUMENTS

| | | |
|---|---|---|
| 6,208,253 B1 | 3/2001 | Fletcher et al. |
| 2007/0127551 A1 | 6/2007 | Conrad |
| 2012/0128030 A1 | 5/2012 | Suess et al. |

FOREIGN PATENT DOCUMENTS

| | | |
|---|---|---|
| CN | 201273846 | 7/2009 |
| CN | 101918803 | 12/2010 |

(Continued)

OTHER PUBLICATIONS

Weaver et al ("Magnetic nanoparticle temperature estimation", Medical Physics, vol. 36, No. 5, May 2009 DOI: 10.1118/1.3106342).*

(Continued)

*Primary Examiner* — Clayton E Laballe
*Assistant Examiner* — Leon W Rhodes, Jr.

(57) ABSTRACT

Provided is a noninvasive measuring method for rapid temperature variation under a DC excitation magnetic field, comprising: (1) positioning ferromagnetic particles at a measured object; (2) applying a DC magnetic field to area of the ferromagnetic particles enabling the ferromagnetic particles to reach saturation magnetization state; (3) obtaining steady temperature $T_1$ of the measured object at room temperature, and calculating initial spontaneous magnetization $M_1$, of the ferromagnetic particles according to the steady temperature $T_1$; (4) detecting amplitude A of a magnetization variation signal of the ferromagnetic particles after temperature of the measured object varies, and calculating temperature $T_2$ after change according to the ampli- (Continued)

tude A of the magnetization variation signal; and (5) calculating temperature variation $\Delta T = T_2 - T_1$ according to the temperature $T_2$ after change and the steady temperature $T_1$. The present invention can realize noninvasive temperature measurement with high speed and high accuracy so as to resolve technical problems of low speed and low precision.

5 Claims, 11 Drawing Sheets

(56) References Cited

FOREIGN PATENT DOCUMENTS

| CN | 102204780 | 10/2011 |
|---|---|---|
| CN | 102207411 | 10/2011 |
| JP | 2011027527 | 2/2011 |

OTHER PUBLICATIONS

Li et al (Comparison of noninvasive and remote temperature estimation employing magnetic nanoparticles in DC and AC applied fields, 2012 IEEE International Instrumentation and Measurement Technology Conference (I2MTC 2012): IEEE. (2012), doi: 10.1109/I2MTC.2012.6229437).*
Bonfig (Measuring temperature by saturation induction, Elektrotechnik56.19 (Oct. 3, 1974): Abstract only).*
Bonfig et al (Contactless digital temperature measuring following the thermic dependence of magnetic properties of ferromagnetic materials, Automatik 17.9 (Sep. 1972): Abstract only).*

* cited by examiner

NONINVASIVE MEASURING METHOD FOR RAPID TEMPERATURE VARIATION UNDER DC EXCITATION MAGNETIC FIELD

CROSS REFERENCE TO RELATED APPLICATIONS

The present application is the U.S. national stage of International Application PCT/CN2014/086283 filed on Sep. 11, 2014, which in turn claims priority to Chinese Patent Application CN2014103748141 files on Jul. 31, 2014.

FIELD OF THE INVENTION

The invention relates to a technical field of rapid and accurate temperature measurement, particularly to a noninvasive measuring method for rapid temperature variation under a DC excitation magnetic field, and more particularly to a noninvasive temperature measuring method under a DC excitation magnetic field based on relationship between saturation magnetization of ferromagnetic particles and temperature featuring high time definition and high temperature definition.

BACKGROUND OF THE INVENTION

Temperature is one of the most basic physical quantities in the nature and temperature measurement is of great importance for cognition of natures of materials in the nature. Rapid temperature measuring method using ferromagnetic particles is a brand new temperature measuring method calculating temperature by detecting magnetization varies of ferromagnetic particles and by certain model relationship, and featuring non-invasion, ultrahigh speed (on nanosecond level) and high accuracy. The temperature measuring method using ferromagnetic particles may be widely used in fields such as laser heating, rapid metal solidification and temperature measurement of motors for its non-invasion and high speed.

Development of engineering technology brings in many heat conduction problems such as ultrashort duration of heat effect, ultrahigh density of transient heat flux and ultrafast temperature variation. Conventional Fourier's Law is no longer applicable for those extraordinary heat conductions of ultrahigh speed, and heat conduction effect not following the Fourier's Law occurring under the extraordinary heat conductions is known as the non-Fourier heat conduction effect. Unfortunately, it is difficult for techniques and devices in prior art to accurately detect temperature variation in such short durations. The problem of ultrashort action duration may be overcome by rapid and noninvasive temperature measurement by ferromagnetic particles and the temperature variation process is monitored for further research.

Particular temperature measuring problems such as pulsating flame temperature measurement in an engine combustion chamber of an aircraft and temperature measurement of high-temperature thermal processing furnace, and welding and casting by high-frequency heating often occur in the field of aerospace, which cannot be resolved effectively by conventional temperature measuring method. Accordingly, temperature measuring devices should feature fast response and high accuracy which can be realized by combining noninvasive rapid temperature measurement by ferromagnetic particles and temperature conduction. Therefore, Non-invasive rapid measuring technology with high accuracy is still an urgent problem to be resolved.

SUMMARY OF THE INVENTION

In view of the above-mentioned problems, it is an objective of the invention to provide a noninvasive temperature measuring method under a DC excitation magnetic field based on relationship between saturation magnetization of ferromagnetic particles and temperature featuring high time definition and high temperature definition, so as to realize noninvasive temperature measurement with high speed and high accuracy and resolve technical problems of low speed and low precision.

To achieve the above objective, there is provided a noninvasive measuring method for rapid temperature variation under a DC excitation magnetic field, comprising steps of:
(1) positioning ferromagnetic particles at a measured object;
(2) applying a DC magnetic field to area of the ferromagnetic particles enabling the ferromagnetic particles to reach saturation magnetization state;
(3) obtaining steady temperature $T_1$ of the measured object at room temperature, and calculating initial spontaneous magnetization $M_1$ of the ferromagnetic particles according to the steady temperature $T_1$;
(4) detecting amplitude A of a magnetization variation signal of the ferromagnetic particles after temperature of the measured object varies, and calculating temperature-after-variation $T_2$ according to the amplitude A of the magnetization variation signal; and
(5) calculating temperature variation $\Delta T = T_2 - T_1$ according to the temperature-after-variation $T_2$ and the steady temperature $T_1$.

In a class of the embodiment, in step (1), the ferromagnetic particles are placed inside the measured object or coated on the surface of the measured object.

In a class of the embodiment, in step (3), the steady temperature $T_1$ of the measured object at room temperature is obtained by a thermocouple or an optical fiber temperature sensor, and the initial spontaneous magnetization $M_1$ of the ferromagnetic particles at temperature $T_1$ is calculated according to a curve between saturation magnetization and temperature of the ferromagnetic particles.

In a class of the embodiment, in step (4), the step of calculating temperature $T_2$ after change according to amplitude A of the magnetization variation signal further comprises:
in terms of a relationship between temperature $T_2$ after change and amplitude A of the magnetization variation signal:

$$A = \frac{\alpha \beta NS}{\Delta t} * \left\{ M(T=0) \cdot \left[ 1 - s\left(\frac{T_2}{T_c}\right)^{\frac{3}{2}} - (1-s)\left(\frac{T_2}{T_c}\right)^{\frac{5}{2}} \right]^{\frac{1}{3}} - M_1 \right\},$$

calculating temperature $T_2$ after change according to amplitude A of the magnetization variation signal, wherein α is the proportional coefficient of magnetization variation $\Delta B$ to spontaneous magnetization variation $\Delta M$, β is amplification factor of a test circuit, N is turns of an inductance coil, S is inner area of the inductance coil, $\Delta t$ is duration of the temperature changing process, M(T=0) is spontaneous magnetization of the ferromagnetic particles at absolute zero temperature, s is a parameter of the thermal demagnetization curve of a ferromagnetic material, $T_c$ is Curie temperature of the ferromagnetic particles, and M(T=0) and $T_c$ are determined for a defined ferromagnetic particle material, and $M_1$ is the initial spontaneous magnetization of the ferromagnetic particles at temperature $T_1$.

In a class of the embodiment, in step (4), the step of detecting amplitude A of the magnetization variation signal of the ferromagnetic particles after temperature of the measured object varies further comprises:

detecting the magnetization variation signal of the ferromagnetic particles in the measured area using two identical single-layer coils as sensors, wherein one inductance coil α is used as a detecting coil, the measured object is contained therein so that the coil can detect all magnetization variation signals of the measured object, the other inductance coil γ is placed at a symmetrical position in the DC magnetic field using as a reference coil, which receives noise in the circumstance instead of induction signals of the measured object, and a magnetization variation signal of the ferromagnetic particles is detected by inductance coil α, which is processed by a conditioning circuit including a differential amplification circuit along with a signal detected by inductance coil γ, whereby detecting amplitude A of the processed magnetization variation signal.

Advantages of the Invention comprise: 1. The invention realizes noninvasive measurement: compared with invasive temperature measuring method, which causes comparatively large damages and tends to change or interfere with properties of the measured object by probes in spite of being simple and convenient to monitor the temperature in real time accurately and directly, noninvasive temperature measuring method is able to realize high accurate measurement under the condition of being almost physically isolated from the measured object. 2. The invention realizes fast measurement: it is impossible to realize temperature measurement below microsecond in the prior art, comparatively, since theoretical hysteresis caused by spontaneous magnetization of ferromagnetic particles changing with temperature is extremely small (about 10 picoseconds), the invention can realize temperature measurement under temperature variation caused by heat conduction on the above timescale. 3. The invention realizes high accurate measurement: for the test signal corresponds to magnetization variation in the measurement, integral calculation can suppress noise in the measurement effectively in the process of obtaining the temperature so as to enable higher accuracy in temperature measurement.

BRIEF DESCRIPTION OF THE ACCOMPANYING DRAWINGS

SPECIFIC EMBODIMENTS OF THE INVENTION

Figure 1:
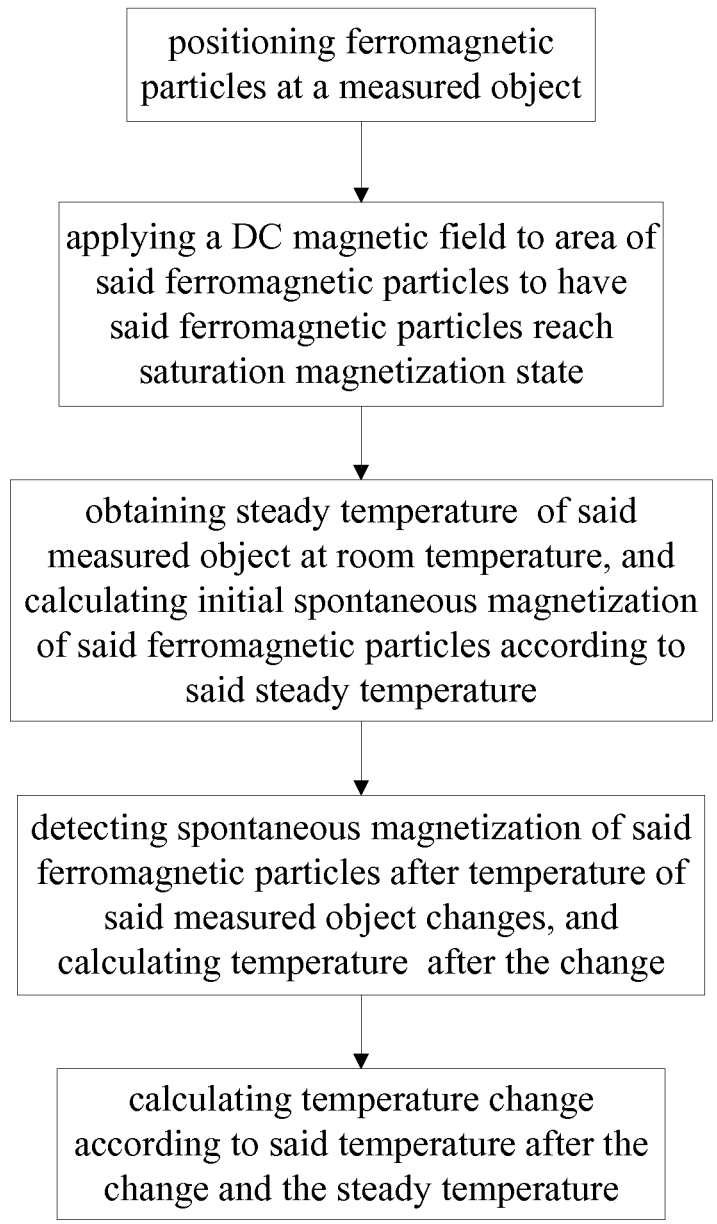
FIG. 1 is a flow chart of a measuring method for rapid temperature variation according to the present invention.

For clear understanding of the objectives, features and advantages of the invention, detailed description of the invention will be given below in conjunction with accompanying drawings and specific embodiments. It should be noted that the embodiments are only meant to explain the invention, and not to limit the scope of the invention.

Principle of temperature measurement of ferromagnetic particles is introduced briefly at first for better understanding of the present invention.

When size of a ferromagnetic particle reduces to a certain scale, its ferromagnetic property converts to paramagnetic property and its magnetic property can be described by the Langevin's function: $M=\varphi M_s(\coth(mH/kT)-kT/mH)$, where $M_s$ is saturation magnetic moment of magnetic nanoparticles, m is averaged magnetic moment of the magnetic nanoparticles, φ is mass of the magnetic nanoparticles (number of the magnetic nanoparticles), k is the Boltzmann's constant, H is an excitation magnetic field, and T is an absolute temperature. Performing Taylor expansion on the Langevin's function, using the AC model, the temperature can be calculated by detecting harmonic waves. However, it is hard to realize measurement with high time definition for it requires that frequency of the AC excitation magnetic field applied to the paramagnetic particles is high enough and magnetization thereof does not attenuate. Response of the paramagnetic nanoparticles is extremely weak and is hard to detect using the DC model. Relationship between spontaneous magnetization of ferromagnetic particles and temperature is determined and can be described by an equation m(τ), no delay occurs in spontaneous magnetization changing with temperature, and therefore selecting ferromagnetic particles as temperature sensitive elements meets the requirement of high time definition in temperature measurement.

For ferromagnetic particles, macro magnetization thereof is formed by distribution of spontaneous magnetization of magnetic domains therein and can be described by the following equation:

$$M = \sum_{i=1}^{n} M_s \cos \theta_i,$$

where $\theta_1$ is an angle between an ith spontaneous magnetization and the magnetic field, and M, is spontaneous magnetization.

Performing temperature measurement by the relationship between residual magnetization and temperature, relationships between residual magnetization and spontaneous magnetization for crystals of different crystal systems are as follows:

| | |
|---|---|
| polycrystal of uniaxial crystal system | $M_r = 0.5 M_s$ |
| polycrystal of triaxial crystal system ($K_1 > 0$) | $M_r = 0.832 M_s$ |
| polycrystal of quadriaxial crystal system ($K_1 < 0$) | $M_r = 0.866 M_s$ |

The above residual magnetization is obtained by reducing the excitation magnetic field to 0 slowly at a state of saturation magnetization. In practice, polycrystal operates on the demagnetization curve in the second quadrant, which makes the relationship between residual magnetization and temperature more complicated. However, under saturation magnetic field, spontaneous magnetizations point to the magnetic field, and macro magnetization at the moment is linear superposition of spontaneous magnetizations, namely $M=M_s$. Therefore, to perform temperature measurement with high time definition, a magnetic field should be applied to the ferromagnetic particles enabling them to reach saturation magnetization state at first, and magnetic response caused by a temperature variation is detected, whereby obtaining the temperature variation. Spontaneous magnetization $M_s$ is the most basic character of ferromagnetic materials. In the last century, people took great efforts to theoretically describe the function of spontaneous magnetization $M_s$ with respect to temperature, which ranges from the absolute zero temperature to the Curie temperature. At present, only saturation magnetization ($0<\tau<1$) at T=0 can be estimated, namely $M_o$ calculated based on Density Functional Theory matches best with $M_o$ obtained by experiments in practice. The Curie temperature $T_c$ is calculated based on Density Functional Theory of classical Heisenberg model and Langevin's Rotating Dynamics Theory in some other researches. The classical approximation method ($s=\infty$) is proved inapplicable, especially for calculation of the Curie temperature $T_c$. As for the equation $m(\tau)$, there has been no equation $m(\tau)$ solely based on experiment being able to describe all ferromagnetic materials (namely law of corresponding state) effectively in the past half century, which can be explained by a theory based on molecular field that $m(\tau)$ merely depends on a dimensionless parameter.

In the past, except for $\tau \rightarrow 0$ and $\tau \rightarrow 1$, no common analytical expression can describe equation $m(\tau)$ in the molecular approximation field. However, an accurate expression of equation $m(\tau)$ when $0<\tau<1$ derived by two or three simple energy theorems is published recently, namely $m(\tau)=[1-s\tau^{3/2}-(1-s)\tau^p]^{1/3}$, where m is normalized spontaneous magnetization, $$m \equiv \frac{M_s}{M_0},$$

$M_s$ is spontaneous magnetization, $M_o$ is spontaneous magnetization at the absolute zero temperature, $M_o=M_s(T=0)$, $\tau$ is normalized temperature, $$\tau \equiv \frac{T}{T_c},$$

$T_c$ is the Curie temperature, s and p are coefficients, $p>3/2$ and $s>0$. The equation follows Bloch's 3/2 energy law in low-temperature region. It can be derived from critical state of the Heisenberg model that when $\tau \rightarrow 0$, $$m \approx 1 - \frac{1}{3} s \tau^{3/2},$$

and $m \approx (1-\tau)^{1/3}$ in the critical area (namely $\tau \rightarrow 1$).

Based on the above technical thoughts, the present invention provides a noninvasive temperature measuring method under a DC excitation magnetic field based on relationship between saturation magnetization of ferromagnetic particles and temperature featuring high time definition and high temperature definition. As in FIG. 1, the method comprises steps of:

(1) positioning ferromagnetic particles at a measured object;
A small amount of ferromagnetic particles are placed inside the measured object or coated on the surface of the measured object by certain method so as to not affect the appearance and normal functioning thereof.

(2) applying a DC magnetic field to area of the ferromagnetic particles enabling the ferromagnetic particles to reach saturation magnetization state;
A constant DC magnetic field $H_{dc}=b$ is applied to area of the ferromagnetic particles enabling the ferromagnetic particles to reach saturation magnetization state. Amplitude of the DC excitation magnetic field having the ferromagnetic particles reach saturation magnetization state is different for different materials.

Figure 2:
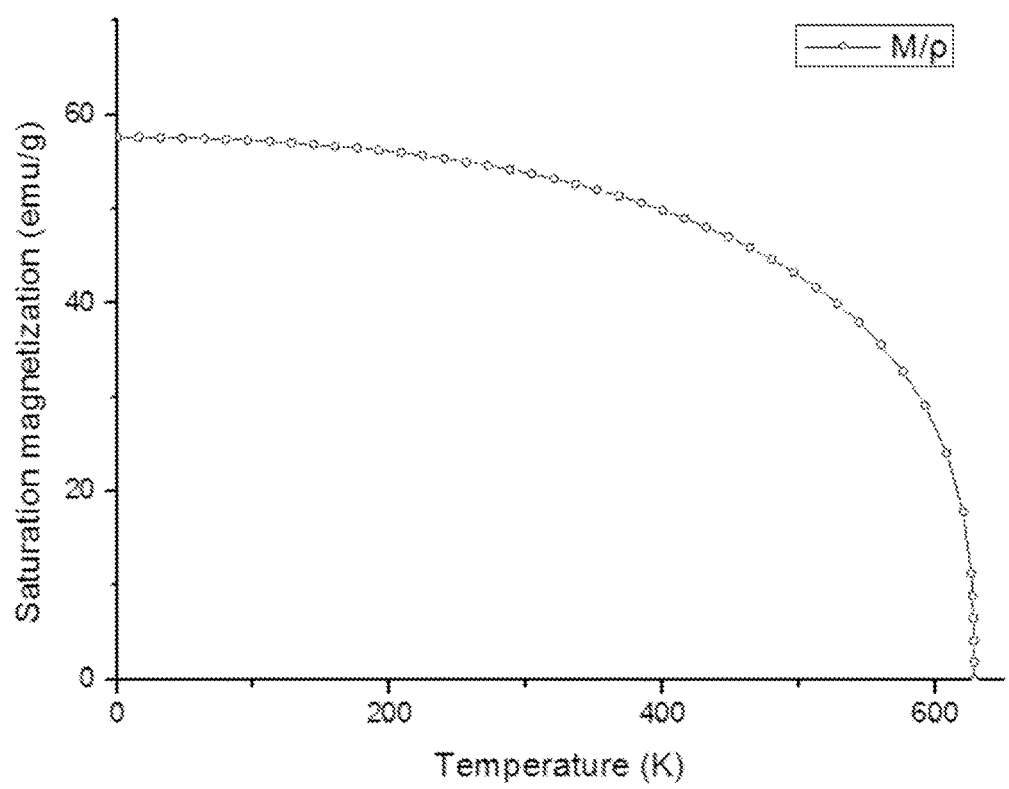
FIG. 2 shows a curve between saturation magnetization and temperature of the ferromagnetic particles according to one embodiment of the present invention.

(3) obtaining steady temperature $T_1$ of the measured object at room temperature, and calculating initial spontaneous magnetization $M_1$, of the ferromagnetic particles according to the steady temperature $T_1$;
Steady temperature $T_1$ of the measured object at room temperature is obtained by device such as a thermocouple or an optical fiber temperature sensor. Saturation magnetization-temperature curve of the ferromagnetic particles is shown in FIG. 2. In the condition that the ferromagnetic particles reach saturation state, spontaneous magnetizations thereof are in one-to-one correspondence with the temperature, and therefore the initial spontaneous magnetization $M_1$, of the ferromagnetic particles at temperature $T_1$ can be calculated.

(4) detecting amplitude A of a magnetization variation signal of the ferromagnetic particles after temperature of the measured object varies, and calculating temperature-after-variation $T_2$ according to the amplitude A of the magnetization variation signal;
When particles are ferromagnetic, relationship between spontaneous magnetization thereof and the temperature are determined, namely equation $m(\tau)=[1-s\tau^{3/2}-(1=s)\tau^p]^{1/3}$, whereby temperature T of the measured object can be obtained, where m is normalized spontaneous magnetization, $$m \equiv \frac{M_s}{M_0},$$

$M_s$ is spontaneous magnetization, $M_o$ is spontaneous magnetization at the absolute zero temperature, $M_o=M_s(T=0)$, $\tau$ is normalized temperature, $$\tau \equiv \frac{T}{T_c},$$

$T_c$ is the Curie temperature, s and p are coefficients, p>3/2 and s>0. The equation follows Bloch's 3/2 energy law in low-temperature region. It can be derived from critical state of the Heisenberg model that when τ→0, $$m \approx 1 - \frac{1}{3}s\tau^{3/2},$$

and m≈(1−τ)$^{1/3}$ in the critical area (namely τ→1).

Therefore, temperature $T_2$ after change can be calculated according to spontaneous magnetization $M_2$ after the temperature variation. However, it is impossible to detect $M_2$ directly, instead, amplitude A of the magnetization variation signal and the corresponding duration Δt of the temperature changing process are to be detected to obtain $M_2$.

Rapid temperature measurement is reflected in the time resolution. Temperature variation with changing duration on a nanosecond scale is imposed on the measured object and amplitude of the response signal thereof and the duration are detected by a test system.

Two identical single-layer coils are used as sensors to detect magnetization variation signals of the ferromagnetic particles in the measured area. One inductance coil $^α$is used as a detecting coil, the measured object is contained therein so that the coil can detect all magnetization variation signals of the measured object, and the other inductance coil γ is placed at a symmetrical position in the DC magnetic field using as a reference coil, which receives noise in the circumstance instead of induction signals of the measured object.

Figure 3:
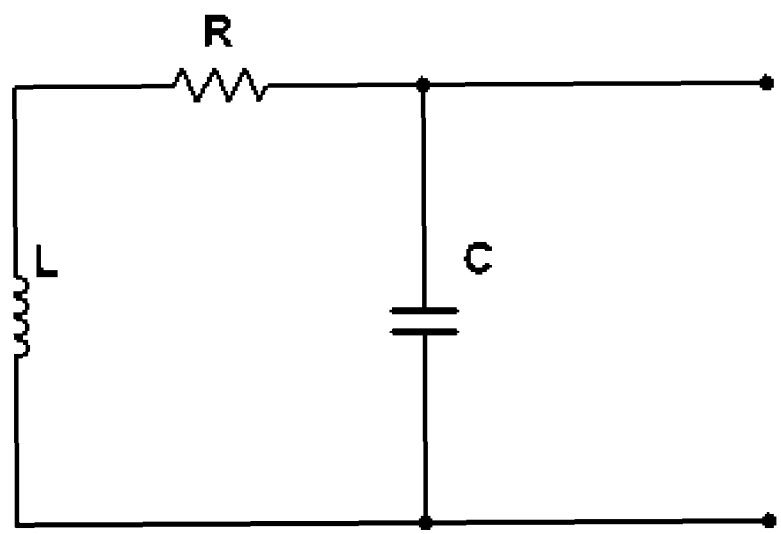
FIG. 3 shows an equivalent model of an inductance coil at high frequencies according to one embodiment of the present invention.

An equivalent model of an inductance coil at high frequencies is shown in FIG. 3. The inductance coil equals an inductance in series with a resistance in parallel with a capacitor and a transfer function thereof is $$\frac{1}{s^2LC + sRC + 1}.$$

Figure 4:
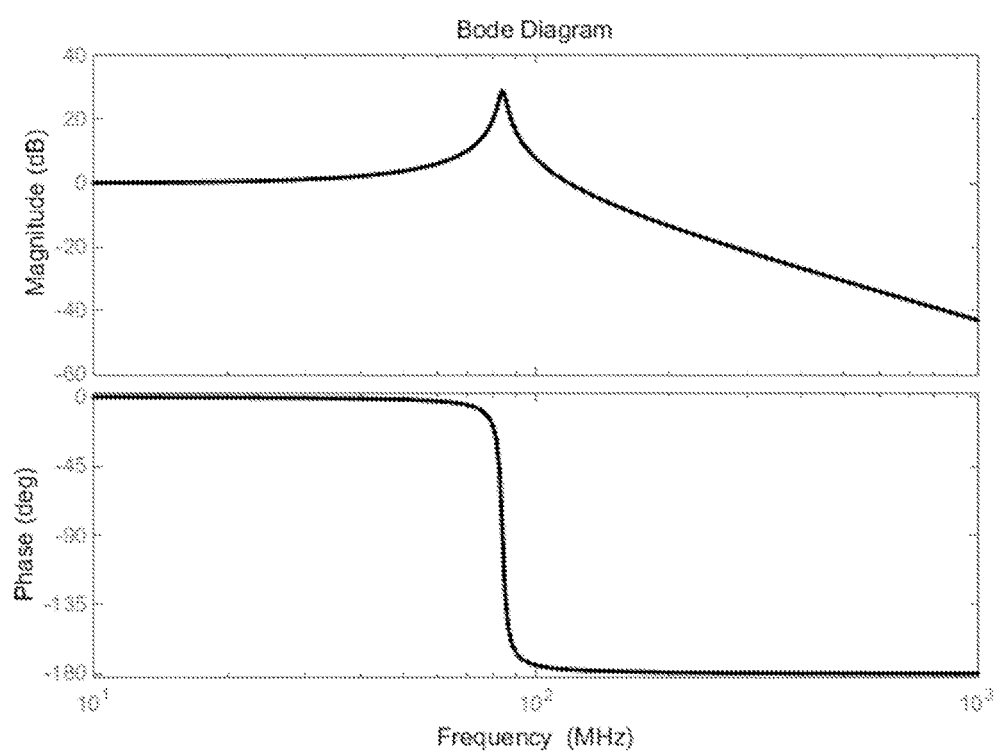
FIG. 4 shows amplitude-frequency response of an equivalent model of an inductance coil at high frequencies.

For an inductance coil with R=5Ω, L=800pμH and C=20pF, an amplitude-frequency response thereof is shown in FIG. 4. When resonant frequency is about 1.2 MHz, temperature variation signal is inevitably disturbed for rapid temperature measurement, especially for duration of the temperature changing process less than 1 us, namely a frequency thereof is higher than 1 MHz. Therefore, resonant frequency of the inductance coil should be improved to expand a normal operating range of rapid temperature measurement. Resonant frequency of an inductance coil can be improved by reducing turns thereof, however, distribution capacitance and inductance thereof are reduced simultaneously which reduces the induction signal response. Therefore, in the condition of assuring an appropriate size of the output signal, using single-layer coils can meet the requirements of both resonant frequency and amplitude of the induction signal.

A single-layer coil has high resonant frequency, but is vulnerable to environmental noise with small response and low SNR (Signal Noise Ratio), which is unfavorable for signal extraction. A high-speed instrument amplifier is applied herein to amplify the two signals differentially so as to suppress common mode interference and increase SNR. A high-speed data acquisition apparatus is applied herein correspondingly.

Collecting magnetization variation signals of the ferromagnetic particle reagent in the measured area is carried out as follows. Output signals of the system are constituted by circuit noise and spatial interference when no heat source is applied, and when temperature starts to change, a heat source generates a heat change with a short duration of Δt in the ferromagnetic particle reagent. Inductance coil $^α$is used to collect magnetization variation signals of the ferromagnetic particles, which are processed by a conditioning circuit including a differential amplification circuit along with signals detected by inductance coil γ. The processed signals are collected by a data acquisition card and stored in a computer for subsequent data processing, whereby obtaining a magnetization variation-time curve of the ferromagnetic particles and a waveform of a response signal. Therefore, output amplitude A of each magnetization variation signal processed by the conditioning circuit and its corresponding changing duration Δt are detected.

Amplitude A of a collected signal is reverted to induce electromotive force ε, namely $$\varepsilon = \frac{A}{\beta},$$

where β is amplification factor of the conditioning circuit. According to Faraday's law of electromagnetic induction, $$\varepsilon = -N\frac{\Delta\Phi}{\Delta t},$$

where ε, is induced electromotive force, N is turns of an inductance coil, ΔΦ is magnetic flux variation, Δt is the duration a change takes. Magnetic flux variation ΔΦ can be calculated, and 66Φ=ΔB*S and ΔB=α*αM, where ΔB is magnetization variation, S is area, a is proportional factor, and ΔM is spontaneous magnetization variation, which can be obtained thereby. A correction value $ΔM_c$ of the spontaneous magnetization variation due to deviation caused by DC drift of the coil can be obtained by performing median filtering of edge optimization on spontaneous magnetization variation ΔM, whereby obtaining a transient value $M_2=M_1+M_c$ of spontaneous magnetization after changing with the temperature.

An expression $$M(t_n) = M(T=0) \cdot \left[1 - s\left(\frac{T}{T_c}\right)^{\frac{3}{2}} - (1-s)\left(\frac{T}{T_c}\right)^{\frac{5}{2}}\right]^{\frac{1}{3}}$$

is derived according to equation m(τ)=[1−sτ$^{3/2}$−(1−s)τ$^p$]$^{1/3}$, on which inverse calculation is performed to obtain a temperature $T_2$, and temperature variation $ΔT=T_2−T_1$, where $t_n$ is time of a nth sampling point, $M(t_o)$ is calculated by an initial temperature, s is a parameter of the thermal demagnetization curve of a ferromagnetic material, M(T=0 is spontaneous magnetization of the ferromagnetic particles at absolute zero temperature, $T_c$ is Curie temperature of the ferromagnetic particles, and M(T=0) and $T_c$ are determined for a defined material. Therefore, a relationship between $M_2$ and $T_2$ can be derived as follows:

$$M_2 = M(T=0) \cdot \left[1 - s\left(\frac{T_2}{T_c}\right)^{\frac{3}{2}} - (1-s)\left(\frac{T_2}{T_c}\right)^{\frac{5}{2}}\right]^{\frac{1}{3}}.$$

A relationship between the temperature after change and the amplitude of the detected signal can be derived according to the above derivation:

$$A = \frac{\alpha \beta N S}{\Delta t} * \left\{ M(T=0) \cdot \left[1 - s\left(\frac{T_2}{T_c}\right)^{\frac{3}{2}} - (1-s)\left(\frac{T_2}{T_c}\right)^{\frac{5}{2}}\right]^{\frac{1}{3}} - M_1 \right\},$$

where A is amplitude of the magnetization variation signal after the temperature variation detected by the coils, $T_2$ is temperature-after-variation, $\alpha$ is the proportional coefficient of magnetization variation $\Delta B$ to spontaneous magnetization variation $\Delta M$, $\beta$ is amplification factor of a test circuit, N is turns of an inductance coil, S is inner area of the inductance coil, $\Delta t$ is duration of the temperature changing process, $M(T=0)$ is spontaneous magnetization of the ferromagnetic particles at absolute zero temperature, s is a parameter of the thermal demagnetization curve of a ferromagnetic material, $T_c$ is Curie temperature of the ferromagnetic particles, $M(T=0)$ and $T_c$ are determined for a defined material, and $M_1$ is the initial spontaneous magnetization of the ferromagnetic particles at temperature $T_1$.

(5) calculating temperature variation $\Delta T = T_2 - T_1$ according to the temperature-after-variation $T_2$ and the steady temperature $T_1$.

Duration 66 t of the rapid temperature changing process can be detected directly by a test system. When multiple temperature variation occur, the temperature variation equals a superposition thereof.

In experiment, for temperature variation on nanosecond scale or below are rare in natural environment, thermal pulses generated by an optical fiber laser are applied to the measured object in engineering to produce fast temperature variation. A thermocouple is placed in the same temperature environment as the measured object using as a temperature reference apparatus simultaneously. Temperature changing states (namely temperature changing environment) are provided by an optical fiber laser or other heat source. Duration is represented by t (on nanosecond scale), and power is represented by P.

Figure 5:
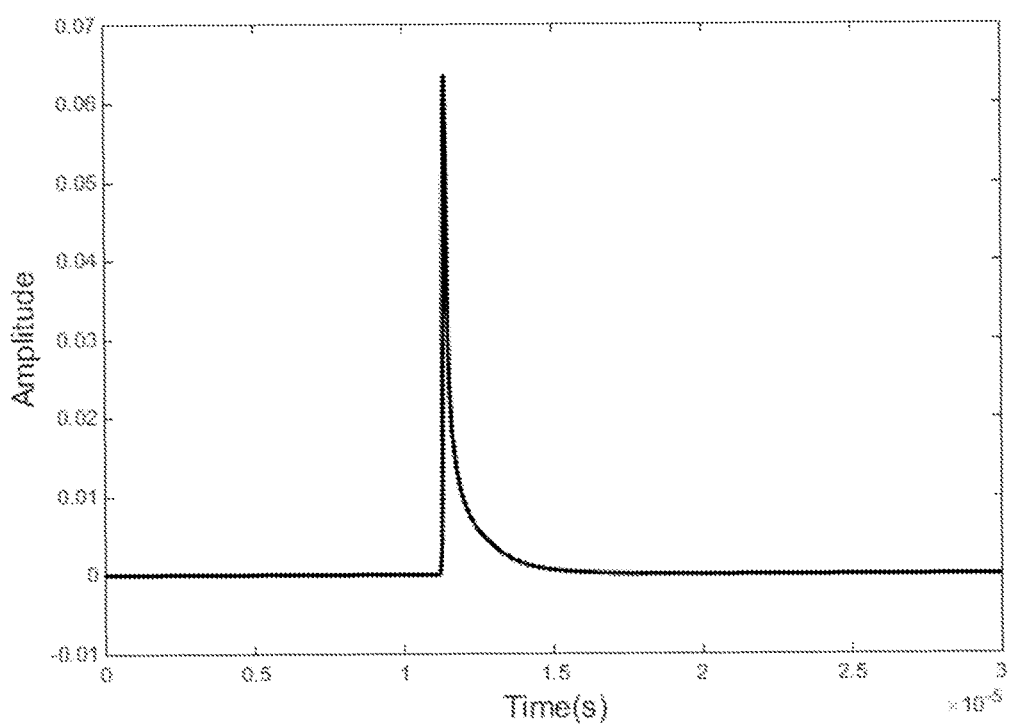
FIG. 5 shows response to a single laser impulse detected by a photovoltaic power diode according to one embodiment of the present invention.
Figure 6:
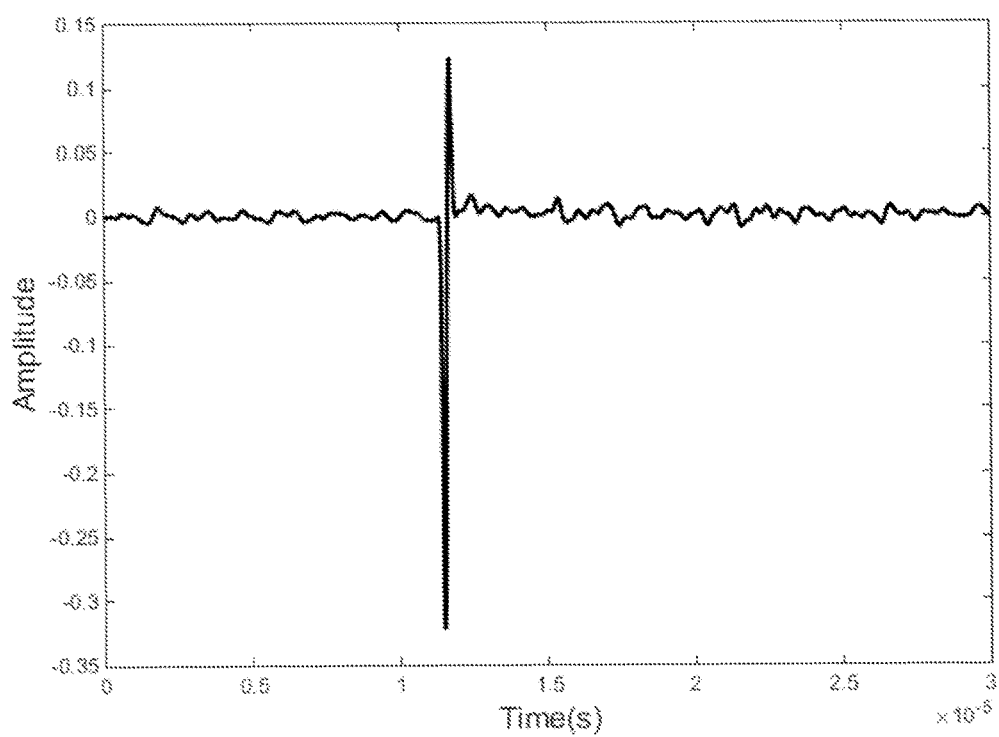
FIG. 6 shows response to a single thermal impulse detected by a coil according to one embodiment of the present invention.

The optical fiber laser for the experiment can generate a pulsed laser beam with a power of 0~20W, a pulse width of 200 ns, a rising time of 130 ns and a frequency of 23.3 kHz. When output of a laser is focused by a lens, power density thereof is extremely large. Therefore, due to restriction of the Curie temperature of the ferromagnetic particles, unfocused output is used with a spot size of about 6 mm, which is able to heat the surface of the measured object uniformly. Response to a single laser impulse detected by a photovoltaic power diode is shown in FIG. 5 and ferromagnetic particles' response to a single thermal impulse detected by a detecting coil is shown in FIG. 6. According to the two figures, rising time thereof approximately equals a standard rising time (130 ns) of a laser output by the laser, namely the test system can clearly distinguish temperature variation in at least 130ns.

Figure 7:
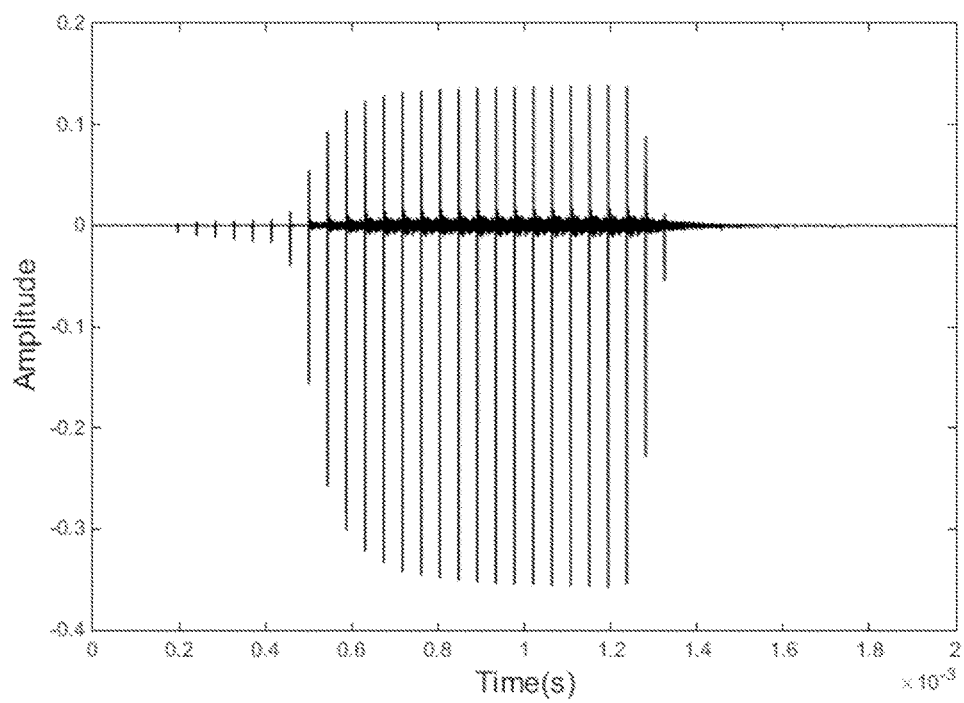
FIG. 7 shows response to a thermal change in 1 ms detected by a coil according to one embodiment of the present invention.
Figure 8:
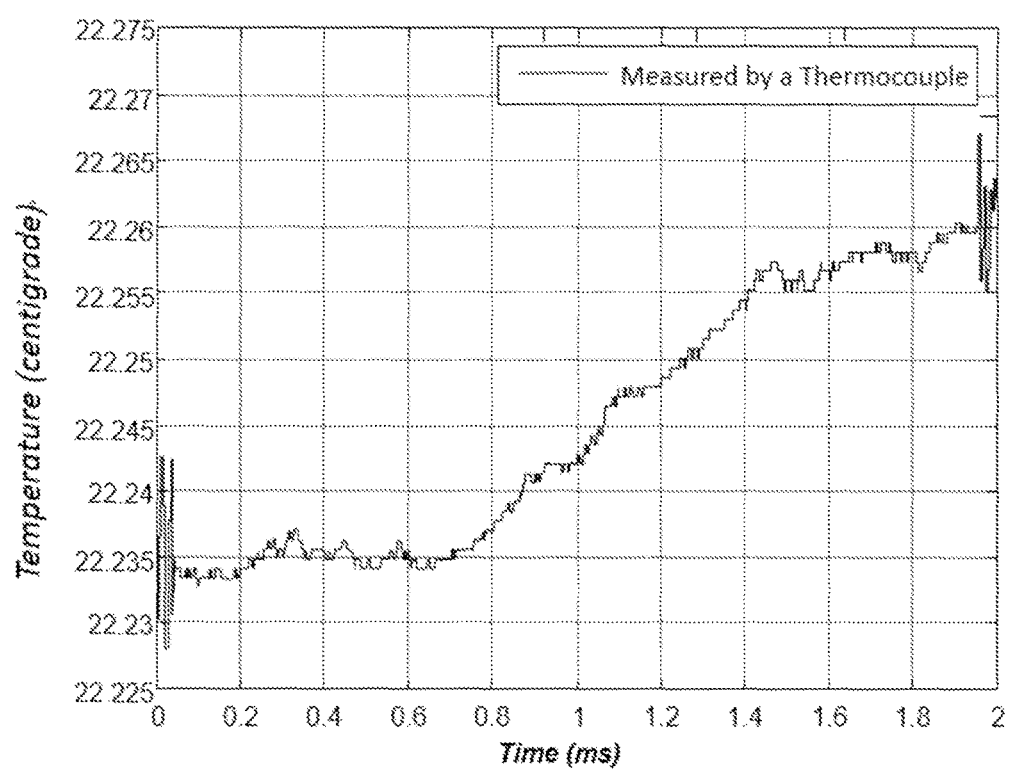
FIG. 8 shows temperature of thermal change in 1 ms detected by a thermocouple according to one embodiment of the present invention.
Figure 9:
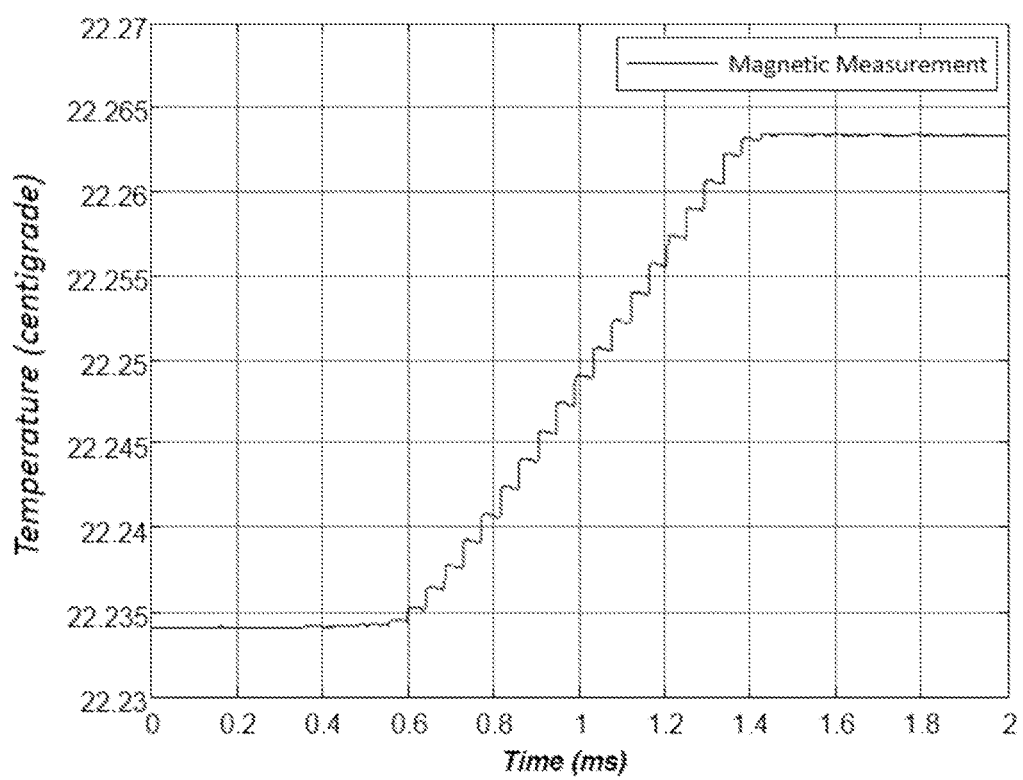
FIG. 9 shows temperature in 1 ms calculated by the method of the present invention according to one embodiment of the present invention.
Figure 10:
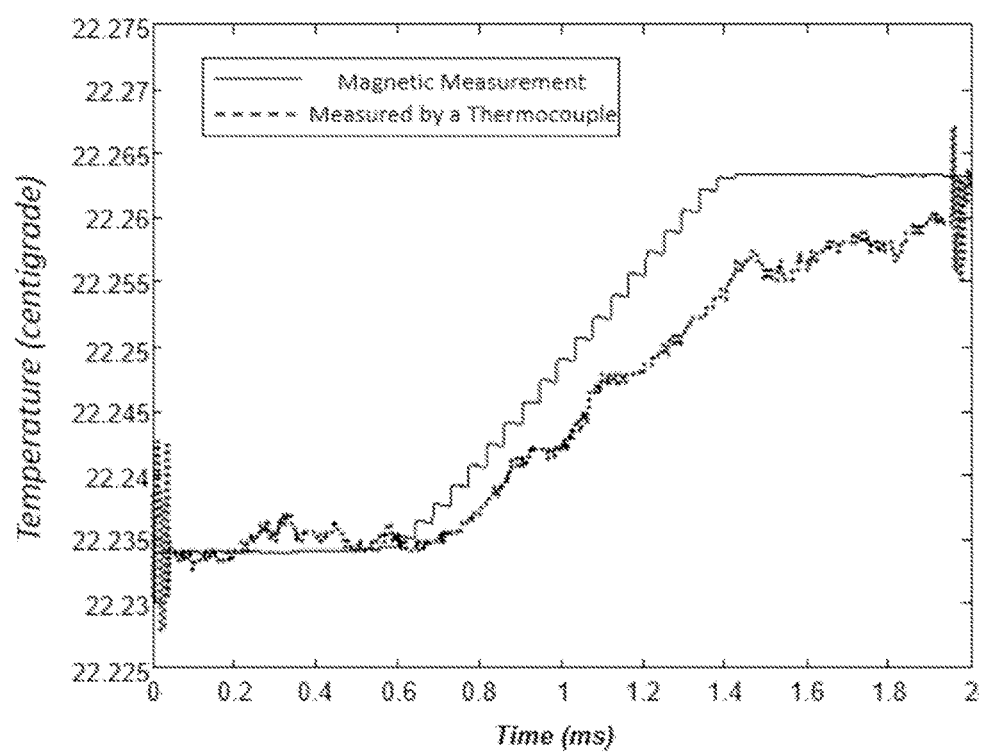
FIG. 10 show a comparison chart of temperature in 1 ms detected by the method of the present invention and by a thermocouple.

Response to a consecutive thermal change by laser in 1 ms detected by the test system is shown in FIG. 7. The total time is 2ms. It is clear that there are more than twenty laser impulse responses, amplitude of each of which can reflect power of a laser impulse, namely temperature variation caused by laser. Amplitude differences of the response impulses at the head and the tail are caused by power instability in the on-and-off process of the laser. Corresponding temperature variation detected by a thermocouple is shown in FIG. 8. It can be inferred that the temperature variationd by about 0.03 ° C. and it is completely impossible to recognize temperature variation produced by each of the impulses. Only a total temperature variation in 1 ms can be reflected. FIG. 9 shows temperature variation after analyzing response information detected by the test system via signal processing algorithms by magnetic measurement, which is compared with that detected by a thermocouple in FIG. 10. It is clear that total temperature variation measured by the two methods are almost identical.

Figure 11:
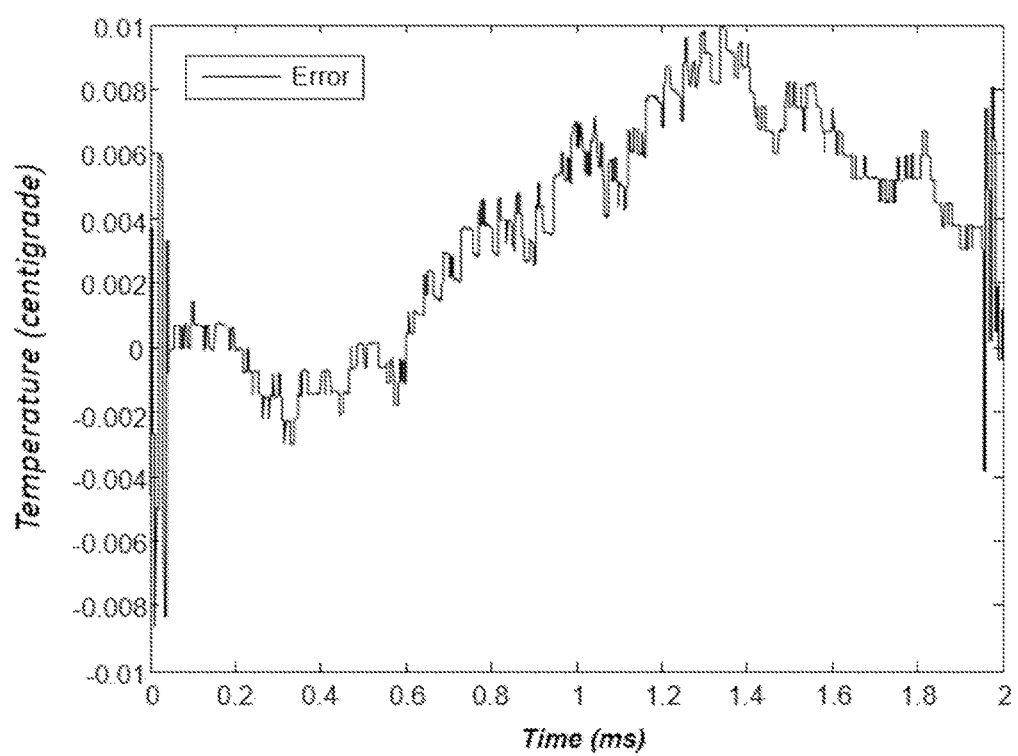
FIG. 11 shows difference of temperature in 1 ms detected by the method of the present invention and by a thermocouple.

However, temperature variation by every laser impulse can be clearly recognized by magnetic measurement, namely magnetic measurement is far superior to thermocouple on temperature definition and time definition. FIG. 11 shows difference of temperature detected by magnetic measurement and by a thermocouple. The maximum temperature error is 0.01° C.

While preferred embodiments of the invention have been described above, the invention is not limited to disclosure in the embodiments and the accompanying drawings. Any varies or modifications without departing from the spirit of the invention fall within the scope of the invention.

What is claimed is:

1. A noninvasive method for measuring rapid temperature variation of a measured object under a DC excitation magnetic field, comprising steps of:
   (1) positioning ferromagnetic particles at an area of said measured object;
   (2) applying said DC excitation magnetic field to said area, thereby enabling said ferromagnetic particles to reach saturation magnetization state;
   (3) obtaining steady temperature $T_1$ of said measured object at room temperature, and calculating initial spontaneous magnetization $M_1$ of said ferromagnetic particles according to said steady temperature $T_1$;
   (4) detecting amplitude A of a magnetization variation signal of said ferromagnetic particles after temperature of said measured object varies, and calculating temperature-after-variation $T_2$ according to said amplitude A of said magnetization variation signal; and
   (5) calculating temperature variation $\Delta T = T_2 - T_1$ according to said temperature-after-variation $T_2$ and said steady temperature $T_1$.
   wherein in said step (4), said calculating temperature-after-variation $T_2$ is performed by: calculating said temperature-after-variation $T_2$ according to a relationship between said temperature-after-variation $T_2$ and said amplitude A of said magnetization variation signal:
   wherein $\alpha$ is proportional coefficient of magnetization variation $\Delta B$ to spontaneous magnetization variation $\Delta M$, $\beta$ is amplification factor of a test circuit, N is turns of an inductance coil, S is inner area of the inductance coil, $\Delta t$ is duration of temperature changing process, $M(T=0)$ is spontaneous magnetization of the ferromagnetic particles at absolute zero temperature, s is a parameter of thermal demagnetization curve of a ferromagnetic material, $T_c$ is Curie temperature of the ferromagnetic particles, $M(T=0)$ and $T_c$ are determined for a defined ferromagnetic particle material, and $M_1$ is the initial spontaneous magnetization of the ferromagnetic particles at temperature $T_1$.

2. The method of claim 1, wherein in said step (1), said ferromagnetic particles are placed inside said measured object or coated on the surface of said measured object.

3. The method of claim 1, wherein in said step (2), said DC excitation magnetic field is applied to said area by a Helmholtz coil.

4. The method of claim 1, wherein in said step (3), said steady temperature $T_1$ of said measured object at room temperature is obtained by a thermocouple or an optical fiber temperature sensor, and wherein said initial spontaneous magnetization $M_1$ of said ferromagnetic particles at temperature $T_1$ is calculated according to a curve between saturation magnetization and temperature of said ferromagnetic particles.

5. The method of claim 1, wherein in said step (4), said detecting amplitude A is performed by:

detecting said magnetization variation signal of said measured object using a first single-layer coil, the measured object contained within said first single-layer coil;

detecting noise in circumstance using a second single-layer coil, the second single-layer coil placed at a symmetrical position in the DC excitation magnetic field;

wherein the first single-layer coil and the second single-layer coil are identical; and processing said magnetization variation signal along with said noise in circumstance by a conditioning circuit having a differential amplification circuit, thereby detecting amplitude A of the processed magnetization variation signal.

* * * * *